(12) United States Patent
Song et al.

(10) Patent No.: US 12,500,193 B2
(45) Date of Patent: Dec. 16, 2025

(54) SEMICONDUCTOR DEVICE

(71) Applicant: TAIWAN SEMICONDUCTOR MANUFACTURING COMPANY LTD., Hsinchu (TW)

(72) Inventors: Jhu-Min Song, Nantou County (TW); Fu-Jier Fan, Hsinchu (TW); Kong-Beng Thei, Hsinchu County (TW); Alexander Kalnitsky, San Francisco, CA (US); Hsiao-Chin Tuan, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 259 days.

(21) Appl. No.: 18/328,789

(22) Filed: Jun. 5, 2023

(65) Prior Publication Data

US 2023/0317656 A1    Oct. 5, 2023

Related U.S. Application Data

(63) Continuation of application No. 17/142,143, filed on Jan. 5, 2021, now Pat. No. 11,710,712.

(51) Int. Cl.
*H01L 23/00* (2006.01)
*H01L 23/48* (2006.01)
(Continued)

(52) U.S. Cl.
CPC .......... *H01L 24/08* (2013.01); *H01L 23/481* (2013.01); *H01L 23/5226* (2013.01);
(Continued)

(58) Field of Classification Search
CPC .............. H01L 23/481; H01L 23/5226; H01L 23/5283; H01L 21/76898; H01L 25/0657; H01L 25/50; H01L 24/08; H01L 24/80
See application file for complete search history.

(56) References Cited

U.S. PATENT DOCUMENTS 7,898,095 B2 *   3/2011   Patti ...................... H01L 23/481
                                                            257/773
8,053,277 B2 *  11/2011   Yu ....................... H01L 25/0652
                                                         257/E21.511
(Continued)

*Primary Examiner* — Zandra V Smith
*Assistant Examiner* — John M Parker
(74) *Attorney, Agent, or Firm* — WPAT LAW; Anthony King

(57) ABSTRACT

A semiconductor device is provided. The semiconductor device includes a first die, a second die, a first through via, and a second through. The first die includes a first substrate, a first interconnection structure disposed on the first substrate, and a plurality of first bonding substructures over the first interconnect structure. The second die includes a second substrate, a second interconnect structure disposed on the second substrate, and a plurality of second bonding substructures over the second interconnect structure. The plurality of second bonding substructures are bonded to the plurality of first bonding substructures. The first through via and the second through via extend through the second substrate and to the second interconnect structure, wherein the first through via and the second through via are electrically disconnected to each other.

20 Claims, 11 Drawing Sheets

(51) Int. Cl.
*H01L 23/522* (2006.01)
*H01L 23/528* (2006.01)

(52) U.S. Cl.
CPC .......... *H01L 23/5283* (2013.01); *H01L 24/80* (2013.01); *H01L 2224/08146* (2013.01); *H01L 2224/80894* (2013.01)

(56) References Cited

U.S. PATENT DOCUMENTS

| | | | | |
|---|---|---|---|---|
| 9,991,244 | B2* | 6/2018 | Lin | H01L 23/481 |
| 2011/0084403 | A1* | 4/2011 | Yang | H01L 25/50 |
| | | | | 257/777 |
| 2014/0117546 | A1* | 5/2014 | Liu | H01L 25/0657 |
| | | | | 438/669 |
| 2014/0264948 | A1* | 9/2014 | Chou | H01L 23/53228 |
| | | | | 438/109 |
| 2015/0021785 | A1* | 1/2015 | Lin | H01L 21/76897 |
| | | | | 438/459 |
| 2015/0108644 | A1* | 4/2015 | Kuang | H01L 25/50 |
| | | | | 257/777 |
| 2015/0364434 | A1* | 12/2015 | Chen | H01L 24/03 |
| | | | | 257/773 |
| 2016/0013160 | A1* | 1/2016 | Chun | H01L 25/50 |
| | | | | 257/751 |
| 2020/0091063 | A1* | 3/2020 | Chen | H01L 25/162 |
| 2020/0395295 | A1* | 12/2020 | Tsai | H01L 24/17 |
| 2022/0115358 | A1* | 4/2022 | Huang | H01L 23/481 |

* cited by examiner

SEMICONDUCTOR DEVICE

PRIORITY CLAIM AND CROSS-REFERENCE

This application is a continuation application of U.S. application Ser. No. 17/142,143, filed Jan. 5, 2021, which is herein incorporated by reference in its entirety.

BACKGROUND

Semiconductor devices are used in a variety of electronic applications, such as personal computers, cell phones, digital cameras, and other electronic equipment. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic elements (e.g., transistors, diodes, resistors, capacitors, etc.) by continuous reductions in minimum feature size, which allow more components to be integrated into a given area. On the other hand, to further achieve an even higher integration density, the semiconductor industry is endeavoring to develop new packaging technologies, such as wafer-scale packaging technologies. The packaging technologies still need to be optimized to achieve higher yield and better performance of the semiconductor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
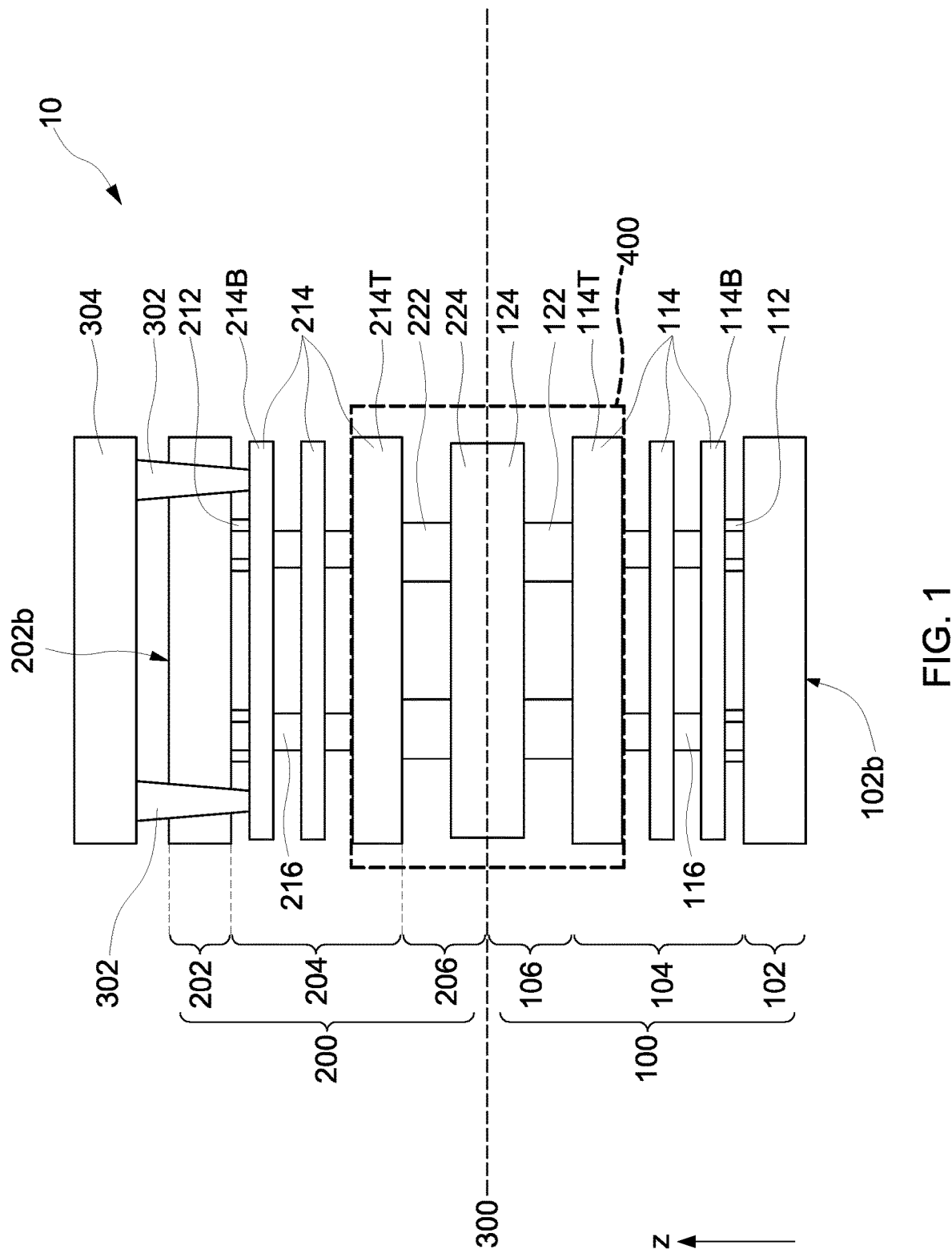
FIG. 1 is a schematic diagram of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, but these elements, components, regions, layers and/or sections should not be limited by these terms. These terms may be only used to distinguish one element, component, region, layer or section from another. The terms such as "first," "second" and "third" when used herein do not imply a sequence, order, or importance unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally means within a value or range (e.g., within 10%, 5%, 1%, or 0.5% of a given value or range) that can be contemplated by people having ordinary skill in the art. Alternatively, the term "substantially," "approximately" or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another end point or between two endpoints. All ranges disclosed herein are inclusive of the endpoints, unless specified otherwise.

In addition to the features or operations for 3D packaging or 3DIC devices disclosed herein, other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In 3D packaging or 3DIC technologies, wafer-level system integration (WLSI) is leading the semiconductor industry into a new era of system scaling that goes beyond the scope defined by Moore's Law, and provides both homogeneous integration and heterogeneous integration. For example, bonding of the same technology nodes or different technology nodes are fully integrated from front end to back end. In WLSI, wafer-on-wafer technology (WoW) is suitable for high-yield, same-die-size wafer integration for leveraging front-end 3D technology, offering a fast, simple and flexible approach for combination of two chips.

FIG. 1 is a schematic diagram of a semiconductor device 10 in accordance with some embodiments of the present disclosure. FIG. 1 is merely for illustration of the technology scheme of the present disclosure. The elements shown in FIG. 1 are merely for illustrative purpose and do not represent actual geometry or detailed arrangement. The semiconductor device 10 is fabricated using wafer-on-wafer (WoW) technology scheme, in which the semiconductor device 10 is fabricated from a first semiconductor wafer 100 and a second semiconductor wafer 200 which are bonded together. The first semiconductor wafer 100 includes a first semiconductor substrate 102, a first interconnect structure 104 over the first semiconductor substrate 102, and a first bonding substructure 106 over the first interconnect structure 104. Similarly, the second semiconductor wafer 200 includes a second semiconductor substrate 202, a second interconnect structure 204 over the second semiconductor substrate 202, and a second bonding substructure 206 over the second interconnect structure 204. The first semiconductor wafer 100 and the second semiconductor wafer 200 are bonded to each other at a bonding interface 300 by the first bonding substructure 106 and the second bonding substructure 206.

The first interconnect structure 104 includes first contact plugs 112 over the first semiconductor substrate 102, first metallization layers 114 over the first contact plugs 112, and first interconnect vias 116 electrically connecting adjacent first metallization layers 114. The first metallization layers 114 include a first bottommost metallization layer 114B and a first topmost metallization layer 114T. The first topmost metallization layer 114T is electrically connected to the first bonding substructure 106. Similarly, the second interconnect structure 204 includes second contact plugs 212 over the second semiconductor substrate 202, second metallization layers 214 over the second contact plugs 212, and second interconnect vias 216 electrically connecting adjacent second metallization layers 214. The second metallization layers 214 include a second bottommost metallization layers 214B and a second topmost metallization layer 214T. The second topmost metallization layer 214T is connected to the second bonding substructure 206.

The first bonding substructure 106 includes first conductive vias 122 over the first topmost metallization layer 114T, and first bonding pads 124 over the first conductive vias 122. Similarly, the second bonding substructure 206 includes second conductive vias 222 over the second topmost metallization layer 214T, and second bonding pads 224 over the second conductive vias 222. The first bonding pads 124 are bonded to the second bonding pads 224 at the bonding interface 300, thereby the first semiconductor wafer 100 and the second semiconductor wafer 200 are bonded to each other.

The semiconductor device 10 also includes through vias 302 extending from a bottom surface 202b of the second semiconductor substrate 202 to the second bottommost metallization layer 214B. The semiconductor device 10 further includes contact pads 304 over and in contact with the through vias 302.

In some embodiments, the first topmost metallization layer 114T is an ultra-thick metal (UTM) layer (for example, thickness≥8500 Å) and has a thickness greater than that of the other first metallization layers 114. Similarly, the second topmost metallization layer 214T may be a UTM layer and has a thickness greater than that of the other second metallization layers 214. The UTM layer may provide better or faster transmission of a signal due to lower electrical resistance. The first topmost metallization layer 114T includes long conductive lines (for example, ≥30000 μm) extending from one side of the semiconductor device 10 to the other side. Similarly, the second topmost metallization layer 214T may also include long conductive lines (for example, ≥30000 μm) extending from one side of the semiconductor device 10 to the other side. In such embodiments, due to the large thickness and length of the first topmost metallization layer 114T and/or the second topmost metallization layer 214T, tensile stress is induced by the first metallization layer 114T and/or the second metallization layer 214T, respectively, due to imbalance of coefficient of thermal expansion (CTE) and/or Young's modulus of different materials. Consequently, wafer warpage occurs substantially, which causes difficulty in wafer-on-wafer bonding or increases debonding (delamination) risk between two dies/chips bonded by WoW technology. The wafer warpage issue becomes even more severe for a high-voltage (HV) display driver IC which is usually designed as a rectangular chip, in which the long conducive lines of the first topmost metallization layer 114T and/or the second topmost metallization layer 214T extend along a long side of the rectangular chip. One approach to address such wafer warpage issue is to apply a pressure during the operation of wafer-on-wafer bonding in an attempt to bend the warped semiconductor wafers back to a flat state. However, the pressure may be so large that it is likely to damage the semiconductor wafers and reduce the yield of the semiconductor devices thus manufactured.

Some embodiments of a semiconductor device and a manufacturing method thereof are therefore provided to alleviate the wafer warpage issue. The long conductive lines of the first metallization layer 114T are segmented into first segments. Similarly, the long conductive lines of the second metallization layer 214T are segmented into second segments. In some embodiments, the first segments and the second segments are connected by bonding structures in series. In some embodiments, by segmentation, pattern density of the first metallization layer 114T and/or the second metallization layer 214T is reduced to a sufficiently low value (such as ≤30%). Accordingly, tensile stress induced by the first metallization layer 114T and/or the second metallization layer 214T is reduced and thereby the first semiconductor wafer 100 and the second wafer 200 can maintain a top surface of better flatness. The wafer warpage issue is thus significantly alleviated. Moreover, advantageously the semiconductor device in accordance with some embodiments of the present disclosure does not show significant increase in resistance and does not require complicated modification of the layout of the semiconductor device or development of a new bonding operation.

Figure 2:
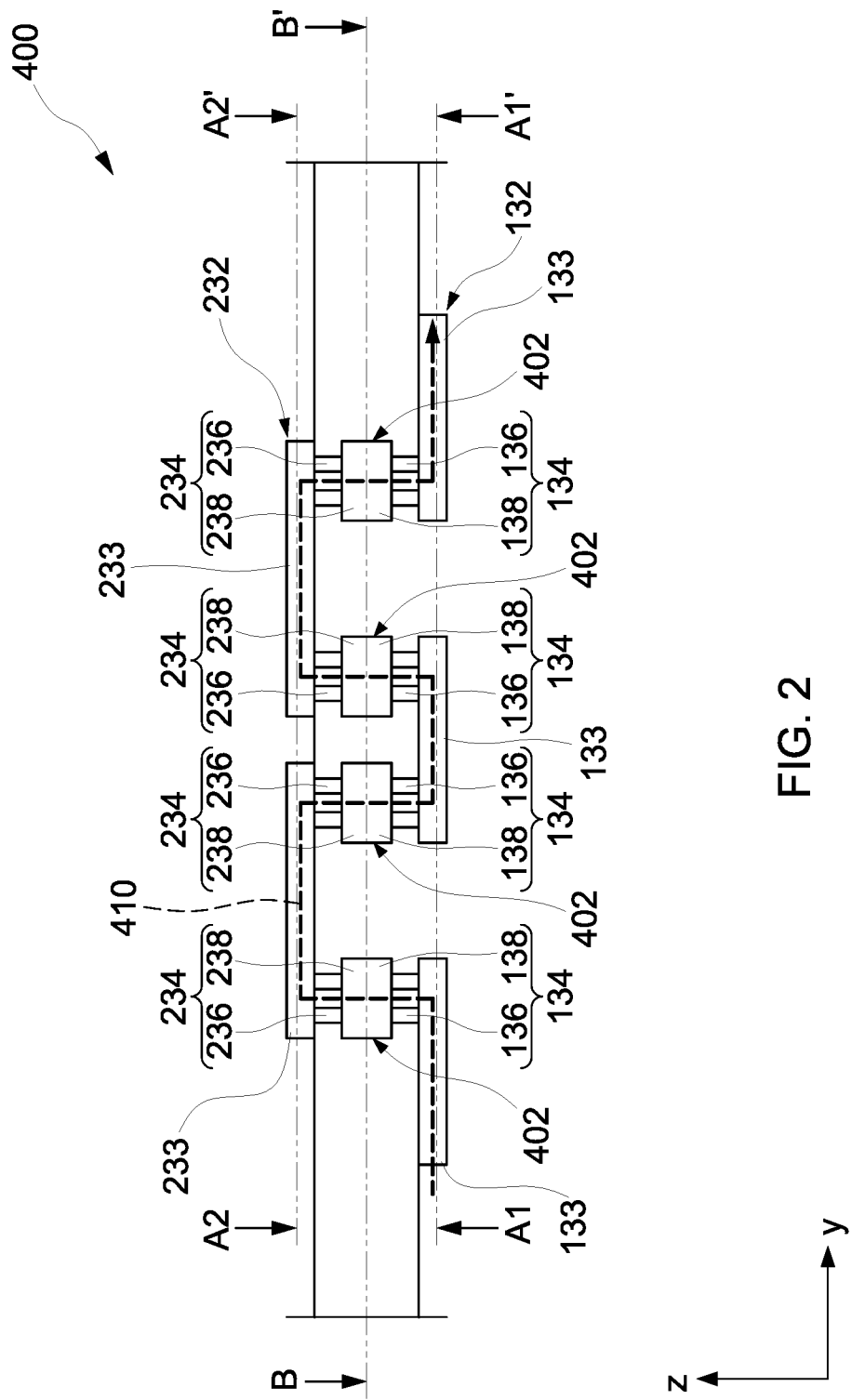
FIG. 2 is a schematic cross-sectional view of a portion of the semiconductor device illustrated in FIG. 1 in accordance with some embodiments of the present disclosure.

FIG. 2 is a schematic cross-sectional view of a portion 400 of the semiconductor device 10 illustrated in FIG. 1 in accordance with some embodiments of the present disclosure. FIG. 2 illustrates a cross-sectional view of the first topmost metallization layer 114T, the first bonding substructure 106, the second topmost metallization layer 214T, and the second bonding substructure 206 illustrated in FIG. 1 with more details. In some embodiments, the first topmost metallization layer 114T of the semiconductor device 10 include a first topmost conductive line 132. Similarly, in some embodiments, the second topmost metallization layer 214T of the semiconductor device 10 include a second topmost conductive line 232. The first topmost conductive line 132 includes a plurality of first segments 133 separated from one another. The second topmost conductive line 232 includes a plurality of second segments 233 separated from one another. In some embodiments, the first segments 133 of the first topmost conductive line 132 are separated from one another by a dielectric material. Similarly, in some embodiments, the second segments 233 of the second topmost conductive line 232 are separated from one another by a dielectric material. In some embodiments, the first segments 133 and/or the second segments 233 form a dashed straight line. In some embodiments, one of the plurality of first segments 134 overlaps two adjacent second segments of the plurality of second segments 234 from a top view.

Referring to FIG. 2, a plurality of bonding structures 402 are disposed between the first conductive line 132 and the second conductive line 232. Each of the plurality of bonding structures 402 is connected to a respective first segment 133 of the plurality of first segments 133 and a respective second segment 233 of the plurality of second segments 233 such that the plurality of first segments 133, the plurality of bonding structures 402 and the plurality of second segments 233 are connected in series. In some embodiments, the plurality of first segments 133, the plurality of bonding structures 402, and the plurality of second segments 233 together form a conductive path 410. In some embodiments, the plurality of bonding structures 402 connect the plurality of first segments 133 and the plurality of second segments 233 alternately. In some embodiments, each of the plurality of bonding structures 402 includes a first bonding substructure 134 connected to the respective first segment 133, and a second bonding substructure 234 connected to the respective second segment 233. In some embodiments, the first bonding substructure 134 and the second bonding substructure 234 are bonded to each other to form the bonding structure 402 between the first topmost conductive line 132 and the second topmost conductive line 232. In some embodiments, the first bonding substructure 134 and the second bonding substructure 234 are bonded to each other directly by, for example, Van der Waals force. In some embodiments, the first bonding substructure 402 includes at least one (for example, two or more) first conductive via 136 connected to the respective first segment 133, and a first bonding pad 138 connected to the at least one first conductive via 136. In some embodiments, the first conductive via 136 and/or the first bonding pad 138 may be disposed in a dielectric material such as silicon oxide, silicon nitride, silicon oxynitride (SiON), SiOCN, fluorine-doped silicate glass (FSG), or a low-k dielectric material, or any other suitable dielectric material, or any combination thereof. In some embodiments, the second bonding substructure 234 includes at least one (for example, two or more) second conductive via 236 connected to the respective second segment 233, and a second bonding pad 238 connected to the at least one second conductive via 236. In some embodiments, the second conductive via 236 and/or the second bonding pad 238 may be disposed in a dielectric material such as silicon oxide, silicon nitride, silicon oxynitride (SiON), SiOCN, fluorine-doped silicate glass (FSG), or a low-k dielectric material, or any other suitable dielectric material, or any combination thereof. In some embodiments, the first bonding pad 138 and the second bonding pad 238 are bonded to each other, for example, directly by Van der Waals force.

Figure 3A:
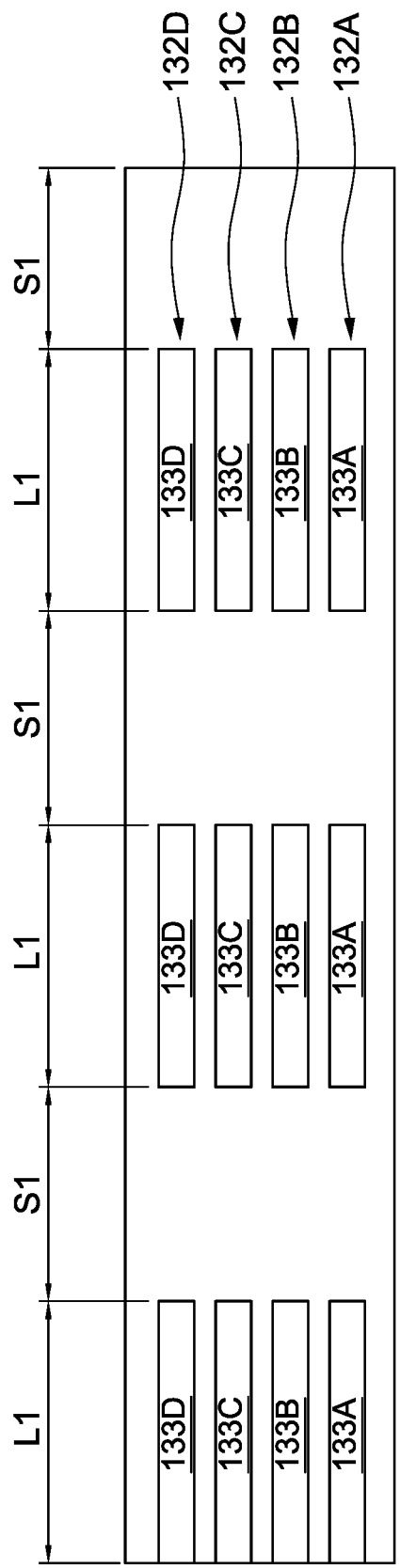
FIG. 3A is a schematic top view of the semiconductor device cut through a line A1-A1' illustrated in FIG. 2, in accordance with some embodiments of the present disclosure.

FIG. 3A is a schematic top view of the semiconductor device cut through a line A1-A1' illustrated in FIG. 2, in accordance with some embodiments of the present disclosure. In some embodiments, the first topmost metallization layer 114T includes a plurality of first topmost conductive lines 132A, 132B, 132C and 132D. In some embodiments, the first topmost conductive lines 132A, 132B, 132C and 132D are disposed parallel to one another. In some embodiments, the first topmost conductive lines 132A, 132B, 132C and 132D include first segments 133A, 133B, 133C and 133D, respectively. By segmentation of the first conductive lines 132A, 132B, 132C and 132D into first segments 133A, 133B, 133C and 133D, tensile stress resulted from the first conductive lines is reduced and thereby the wafer warpage issue is mitigated. It should be noted that the first topmost conductive lines 132A, 132B, 132C and 132D shown in FIG. 3A are merely illustrative, and the scope of the present disclosure is not limited thereto. For example, the first topmost metallization layer 114T may include any suitable number of first topmost conductive lines as needed, such as more than four first conductive lines, and the first topmost conductive lines may have different lengths and may be segmented into first segments of different lengths.

As shown in FIG. 3A, the first segments 133A, 133B, 133C and 133D have a first length L1 and are separated from an adjacent first segment by a first spacing S1. In some embodiments, a ratio of the first length to the first spacing (L1/S1) is in a range of between about 0.6 and about 1.2. In some comparative approaches, when the ratio is less than 0.6 or more than 1.2, the wafer warpage issue may not be alleviated without side effect such as increased electrical resistance.

Figure 3B:
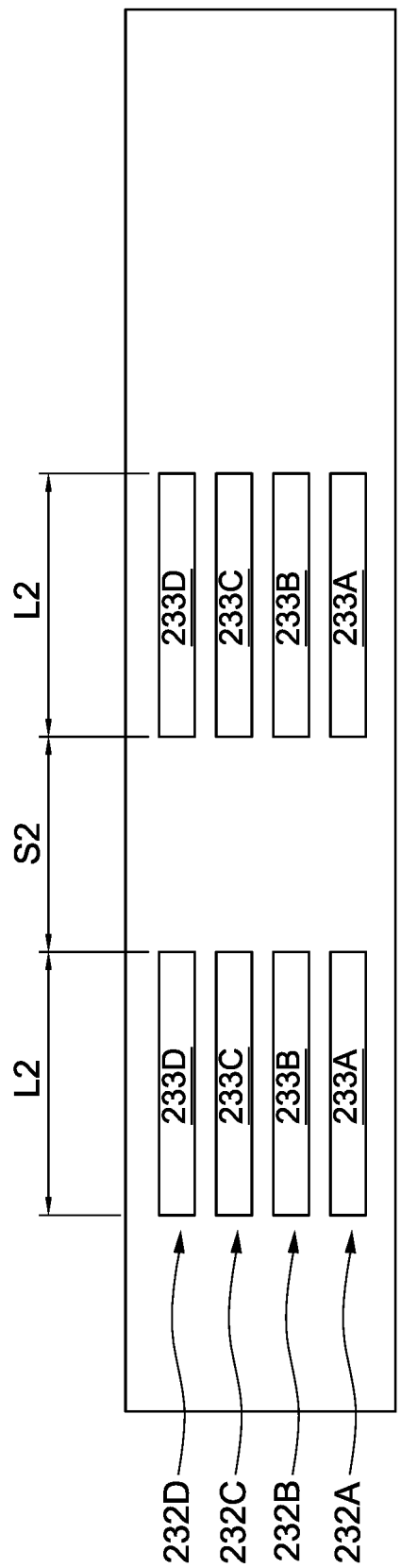
FIG. 3B is a schematic top view of the semiconductor device cut through a line A2-A2' illustrated in FIG. 2, in accordance with some embodiments of the present disclosure.

FIG. 3B is a schematic top view of the semiconductor device cut through a line A2-A2' illustrated in FIG. 2, in accordance with some embodiments of the present disclosure. In some embodiments, the second topmost metallization layer 214T includes a plurality of second topmost conductive lines 232A, 232B, 232C and 232D. In some embodiments, the second topmost conductive lines 232A, 232B, 232C and 232D are disposed parallel to one another.

In some embodiments, the second topmost conductive lines 232A, 232B, 232C and 232D include second segments 233A, 233B, 233C and 233D, respectively. By segmentation of the second conductive lines 232A, 232B, 232C and 232D into second segments 233A, 233B, 233C and 233D, tensile stress resulted from the second conductive lines is reduced and thereby the wafer warpage issue is mitigated. In some embodiments, the second segments 233A, 233B, 233C and 233D are disposed over spacings of the first segments 133A, 133B, 133C and 133D. It should be noted that the second topmost conductive lines 232A, 232B, 232C and 232D shown in FIG. 3B are merely illustrative, and the scope of the present disclosure is not limited thereto. For example, the second topmost metallization layer 214T may include any suitable number of second topmost conductive lines as needed, such as more than four second conductive lines, and the second topmost conductive lines may have different lengths and may be segmented into second segments of different lengths.

As shown in FIG. 3B, in some embodiments, the second segments have a second length L2 and is separated from an adjacent second segment by a second spacing S2. A ratio of the second length to the second spacing (L2/S2) is in a range of between about 0.6 and about 1.2.

In some embodiments, the first length L1 of the first segments and/or the second length L2 of the second segments is substantially equal to or less than 250 μm. In some embodiments, the first spacing S1 between the first segments and/or the second spacing S2 between the second segments is substantially equal to or less than 250 μm. It should be noted that the first length L1 and the first spacing S1 shown in FIG. 3A, and the second length L2 and the second spacing S2 shown in FIG. 3B are merely illustrative, and the scope of the present disclosure is not limited thereto. For example, the first segments 133A, 133B, 133C and 133D and the second segments 233A, 233B, 233C and 233D may have various lengths (e.g., L1', L1'', etc.) and spacings (e.g., S1', S1'', etc.) as needed.

FIG. 3A illustrates a first cross section of the first semiconductor wafer 100 parallel to a bottom surface 102b of the first semiconductor substrate 102 of FIG. 1. FIG. 3B illustrates a second cross section of the second semiconductor wafer 200 parallel to a bottom surface 202b of the second semiconductor substrate 202 of FIG. 1. In some embodiments, at the first cross section, a ratio (also referred to as pattern density) of an area of the first topmost conductive lines such as 132A, 132B, 132C and 132D to a total area of the first cross section is substantially equal to or less than 30%. In some embodiments, at the second cross section, a ratio of an area of the second topmost conductive lines such as 232A, 232B, 232C and 232D to a total area of the second cross section is substantially equal to or less than 30%. The sufficiently low pattern density of the first topmost conductive lines and/or the second topmost conductive lines reduces tensile stress resulted from the first topmost conductive lines and/or the second topmost conductive lines. As a result, the wafer warpage issue is alleviated.

Figure 4:
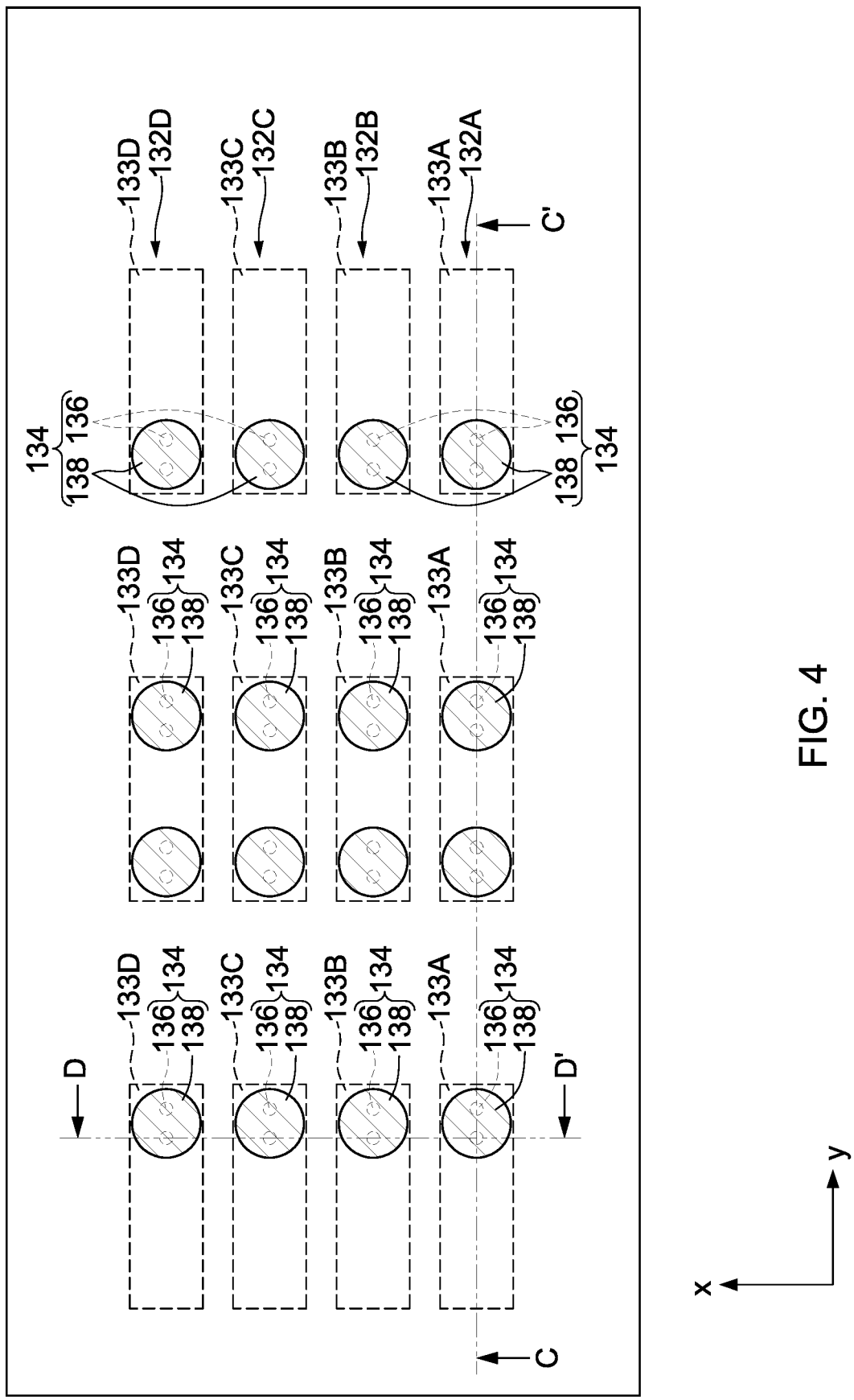
FIG. 4 is a schematic top view of the semiconductor device cut through a line B-B' illustrated in FIG. 2, in accordance with some embodiments of the present disclosure.

FIG. 4 is a schematic top view of the semiconductor device cut through a line B-B' illustrated in FIG. 2, in accordance with some embodiments of the present disclosure. In FIG. 4, the features depicted in dashed lines are disposed below those depicted in solid lines. As shown in FIG. 4, the first bonding substructures 134 are disposed on the ends of the first segments such as 133A, 133B, 133C and 133D. The first segments such as 133A, 133B, 133C and 133D enclose the first bonding substructures 134 from a top view. At least some (for example, each) of the first bonding substructures 134 include a bonding pad 138 and at least one (for example, two) conductive via 136. In some embodiments as shown in FIG. 4, the bonding pads 138 and the conductive vias 136 are round or oval shaped, but the scope of the present disclosure is not limited thereto. In some embodiments, two round shaped conductive vias 136 are disposed on a diameter of one round shaped bonding pad 138.

Figure 5:
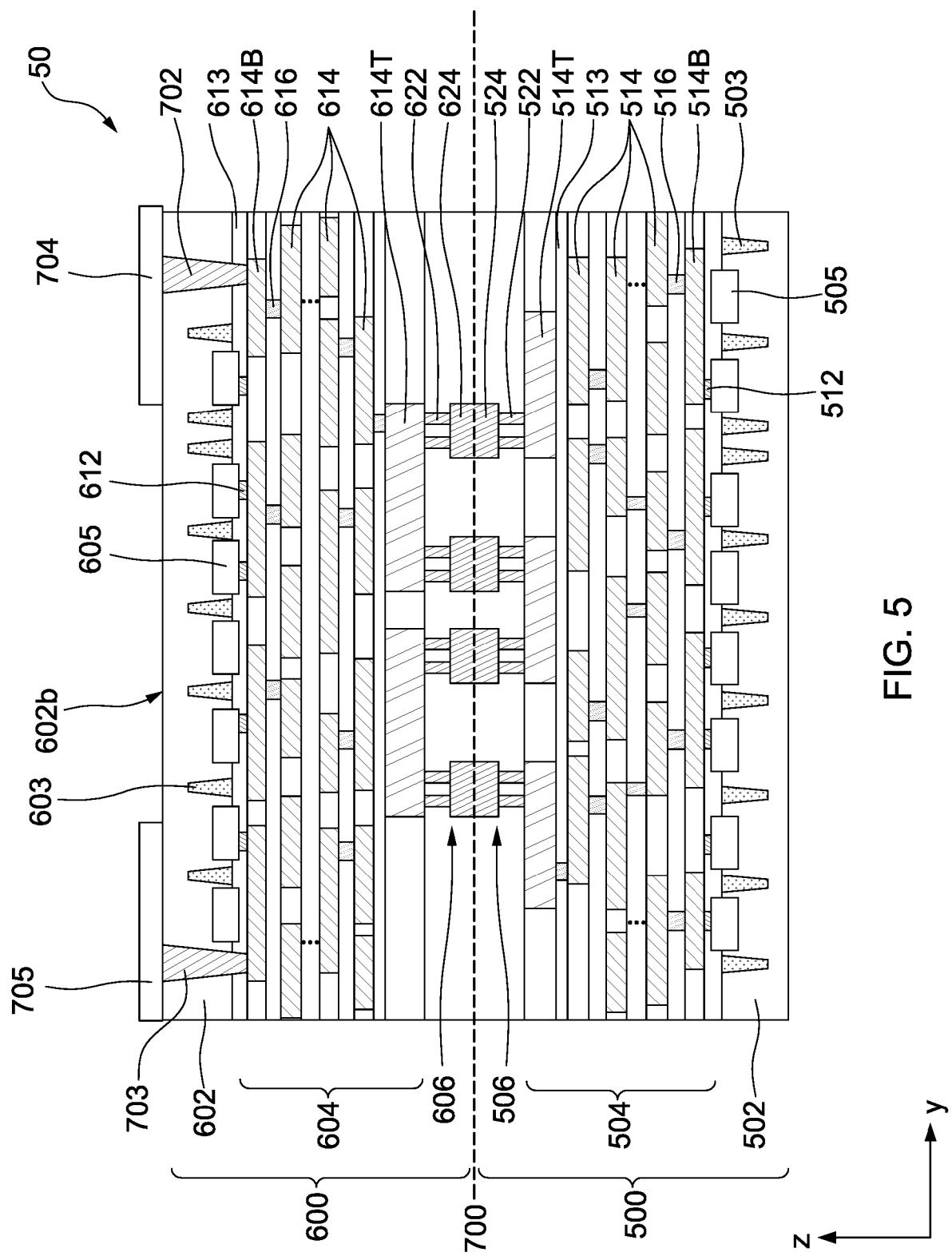
FIG. 5 is a schematic cross-sectional view of a semiconductor device along a line C-C' illustrated in FIG. 4 in accordance with some embodiments of the present disclosure.
Figure 6:
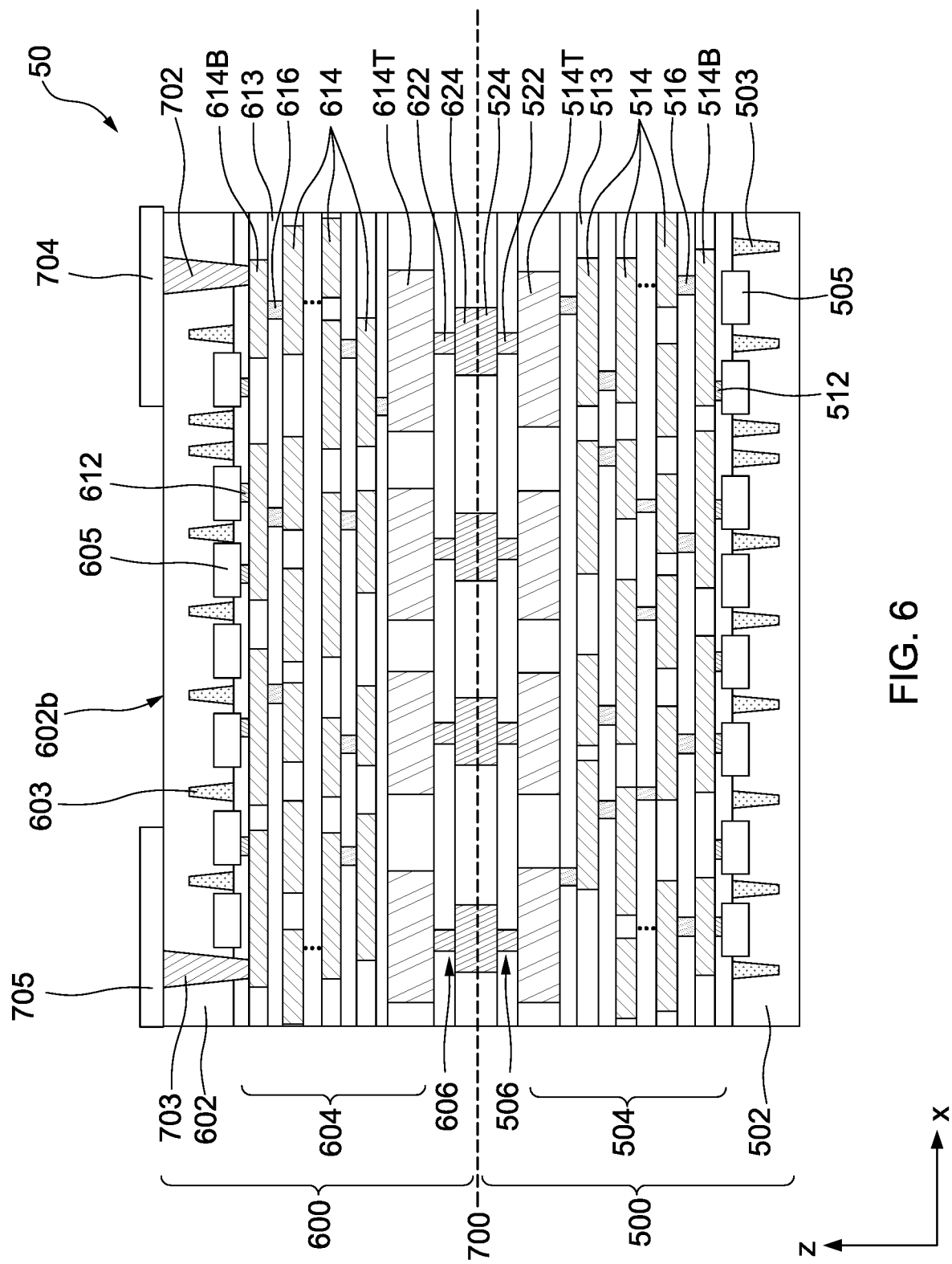
FIG. 6 is a schematic cross-sectional view of a semiconductor device along a line D-D' illustrated in FIG. 4 in accordance with some embodiments of the present disclosure.

FIG. 5 is a schematic cross-sectional view of a semiconductor device along a line C-C' illustrated in FIG. 4, and FIG. 6 is a schematic cross-sectional view of a semiconductor device along a line D-D' illustrated in FIG. 4, in accordance with some embodiments of the present disclosure. FIGS. 5 and 6 illustrate a semiconductor device 50 with more details in accordance with some embodiments of the present disclosure. After sawing/singulation, the semiconductor device 50 includes a first die 500, and a second die 600 over the first die 500. The first die 500 includes a first semiconductor substrate 502, a first interconnect structure 504 over the first semiconductor substrate 502, and a plurality of first bonding substructures 506 over the first interconnect structure 504. The second die 600 includes a second semiconductor substrate 602, a second interconnect structure 604 over the second semiconductor substrate 602, and a plurality of second bonding substructures 606 over the second interconnect structure 604.

The first semiconductor substrate 502 and the second semiconductor substrate 602 may include the same or different materials. In some embodiments, the first semiconductor substrate 502 and the second semiconductor substrate 602 may include elementary semiconductor materials, compound semiconductor materials, or alloy semiconductor materials. Examples of elementary semiconductor materials may be, for example but not limited thereto, single crystal silicon, polysilicon, amorphous silicon, germanium (Ge), and/or diamond. Examples of compound semiconductor materials may be, for example but not limited thereto, silicon carbide (SiC), gallium arsenide (GaAs), gallium phosphide (GaP), indium phosphide (InP), indium arsenide (InAs), and/or indium antimonide (InSb). Examples of alloy semiconductor materials may be, for example but not limited thereto, SiGe, GaAsP, AlInAs, AlGaAs, GaInAs, GaInP, and/or GaInAsP. In some embodiments, the first semiconductor substrate 502 and the second semiconductor substrate 602 may include various doping configurations depending on design requirements as is known in the art. For example, different doping profiles (e.g., n wells and p wells) may be formed on the semiconductor substrates in regions designed for different device types (e.g., n-type field effect transistors (NFET), p-type field effect transistors (PFET)). The suitable doping may include ion implantation of dopants and/or diffusion processes.

The first die 500 also includes a plurality of first devices 505 on the first semiconductor substrate 502. The plurality of first devices 505 are separated from one another by at least one first isolation structure 503. Similarly, the second die 600 also includes a plurality of second devices 605 on the second semiconductor substrate 602, and the plurality of second devices 605 are separated from one another by at least one second isolation structure 603. In some embodiments, the first devices 505 and the second devices 605 are formed on the first semiconductor substrate 502 and the second semiconductor substrate 602, respectively, in frond-end-of-line (FEOL) operations. In some embodiments, the first devices 505 of the first die 500 and the second devices 605 of the second die 600 are formed with different technology nodes. In some embodiments, the first devices 505 and the second devices 605 are formed with the same technology node. In some embodiments, the first devices 505 and/or the second devices 605 include gate structures and source/drain (S/D) regions. In some embodiments, the first isolation structures 503 and/or the second isolation structures 603 include shallow trench isolation (STI) structures.

The first devices 505 and/or the second devices 605 may form various N-type metal-oxide-semiconductor (NMOS) and/or P-type metal-oxide-semiconductor (PMOS) devices, such as transistors, memories, or the like, which are interconnected to perform one or more functions. Other devices, such as capacitors, resistors, diodes, photo-diodes, fuses, or the like, may also be formed on the first semiconductor substrate 502 and/or the second semiconductor substrate 602.

The first interconnect structure 504 include a plurality of first dielectric layers 513, a plurality of first metallization layers 514 alternately stacked on the first dielectric layers 513. The first interconnect structure 504 may further include a plurality of first contact plugs 512 in the first dielectric layer 513 and over the first semiconductor substrate 502. The plurality of first contact plugs 512 are electrically connected to adjacent first metallization layers 514. The first interconnect structure 504 may further include a plurality of first interconnect vias 516, each of which electrically connects two adjacent first metallization layers 514. The plurality of first metallization layers 514 include a first bottommost metallization layer 514B and a first topmost metallization layer 514T. In some embodiments, the first topmost metallization layer 514T is an ultra-thick metal (UTM) layer, which is thicker than the other (i.e., lower) first metallization layers 514 and has, for example, a thickness of more than 8500 Å. A portion of the first topmost metallization layer 514T includes a first topmost conductive line, such as the first topmost conductive line 132 including a plurality of first segments 133 separated from one another as stated above. The plurality of first contact plugs 512 electrically connect the first devices 505 to the first bottommost metallization layer 514B. In some embodiments, the first devices 505 are interconnected via the first contact plugs 512 and the first bottommost metallization layer 514B.

Similarly, in some embodiments, the second interconnect structure 604 include a plurality of second dielectric layers 613, a plurality of second metallization layers 614 alternately stacked on the second dielectric layers 613. The second interconnect structure 604 may further include a plurality of second contact plugs 612 in the second dielectric layer 613 and over the second semiconductor substrate 602. The plurality of second contact plugs 612 are electrically connected to adjacent second metallization layers 614. The second interconnect structure 604 may further include a plurality of second interconnect vias 616, each of which electrically connect two adjacent second metallization layers 614. The plurality of second metallization layers 614 include a second bottommost metallization layer 614B and a second topmost metallization layer 614T. In some embodiments, the second topmost metallization layer 614T is an ultra-thick metal (UTM) layer, which is thicker than the other (i.e., lower) second metallization layers 614 and has, for example, a thickness of more than 8500 Å. The second topmost metallization layer 614T includes a second topmost conductive line, such as the second topmost conductive line 232 including a plurality of second segments 233 separated from one another as stated above. The plurality of second contact plugs 612 connect the second devices 605 to the second bottommost metallization layer 614B. In some embodiments, the second devices 605 are interconnected via the second contact plugs 612 and the second bottommost metallization layer 614B.

In some embodiments, the first metallization layers 514, the second metallization layers 614, the first contact plugs 512, the second contact plugs 612, the first interconnect vias 516 and the second interconnect vias 616, independent from one another, include a conductive material such as copper, nickel, aluminum, copper aluminum, tungsten, titanium, or any other suitable material, or a combination thereof, but the disclosure is not limited thereto. In some embodiments, the first dielectric layers 513 and the second dielectric layers 613 include a dielectric material such as silicon oxide, silicon nitride, silicon oxynitride (SiON), SiOCN, fluorine-doped silicate glass (FSG), or a low-k dielectric material, or any other suitable dielectric material, or any combination thereof.

In some embodiments, one of the plurality of first bonding substructures 506 includes at least one (for example, two) first conductive via 522 connected to the first topmost metallization layer 514T, and a first bonding pad 524 connected to the at least one first conductive via 522. In some embodiments, the first bonding substructures 506 are the first bonding substructures 134, the first conductive vias 522 are the first conductive vias 136, the first bonding pads 524 are the first bonding pads 138 as stated above. Similarly, one of the plurality of second bonding substructures 606 include at least one (for example, two) second conductive via 622 connected to the second topmost metallization layer 614T, and a second bonding pad 624 connected to the at least one second conductive via 622. In some embodiments, the second bonding substructures 606 are the second bonding substructures 234, the second conductive vias 622 are the second conductive vias 236, the second bonding pads 624 are the second bonding pad 238 as stated above. The plurality of first bonding substructures 506 are bonded to the plurality of second bonding substructures 606 such that the plurality of first segments of the first topmost metallization layer 514T, the plurality of first bonding substructures 506, the plurality of second bonding substructure 606 and the plurality of second segments of the second topmost metallization layer 614T are connected in series. In some embodiments, the first bonding pads 524 are directly bonded to the second bonding pads 624. In some embodiments, the first conductive vias 522, the first bonding pads 524, the second conductive vias 622, and the second bonding pads 624 include a conductive material such as copper, nickel, aluminum, copper aluminum, tungsten, titanium, or any other suitable material, or a combination thereof, but the disclosure is not limited thereto.

As shown in FIGS. 5 and 6, the semiconductor device 50 further includes a plurality of through vias, such as a first through via 702 and a second through via 703, extending from a bottom surface 602b of the second semiconductor substrate 602 to the second bottommost metallization layer 614B of the second interconnect structure 604. The semiconductor device 50 further includes a plurality of contact pads, such as a first contact pad 704 and a second contact pad 705, on the bottom surface 602b of the second semiconductor substrate 602. The plurality of contact pads are in contact with the plurality of through vias. For example, the first contact pad 704 is in contact with the first through via 702, and the second contact pad 705 is in contact with the second through via 703. The plurality of the contact pads can connect the first devices 505 and the second devices 605 to external circuits. In some embodiments, the plurality of through vias, such as the first through via 702 and the second through via 703, include a liner (made of an insulating material such as oxides or nitrides), a diffusion barrier layer (made of a material such as Ta, TaN, Ti, TiN, or CoW) and a conductive material such as copper, aluminum, aluminum copper, aluminum silicon copper, tungsten, titanium, tantalum, titanium nitride, tantalum nitride, nickel silicide, cobalt silicide, other proper conductive materials, or combinations thereof. In some embodiments, the plurality of contact pads, such as the first contact pads 704 and the second contact pad 705, include a conductive material with low resistivity, such as aluminum, aluminum alloy, or any other suitable material, or any combination thereof.

In some embodiments, at least one first device 505 is electrically connected to the first through via 702, for example, by the first contact plug 512, the first metallization layers 514, the first interconnect vias 516, the first bonding substructures 506, the second bonding substructures 606, the second interconnect vias 616, and the second metallization layers 614. In some embodiments, to avoid interference between the first devices 505 and the second devices 605, the first through via 702 is electrically disconnected to the second devices 605, for example, by isolating the second bottommost metallization layer 614B to which the first through via 702 is connected from the second devices 605. In some embodiments, the second through via 703 is electrically connected to at least one second device 605, for example, by the second bottommost metallization layer 614B and the second contact plug 612. In some embodiments, to avoid interference between the first devices 505 and the second devices 605, the second through via 703 is electrically disconnected to the first devices 505, for example, by isolating the second bottommost metallization layer 614B to which the second through via 703 is connected from the first devices 505. In some embodiments, the first through via 702 and the second through via 703 are electrically disconnected to each other.

The present disclosure is not limited to the above-mentioned embodiments, and may include other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 7:
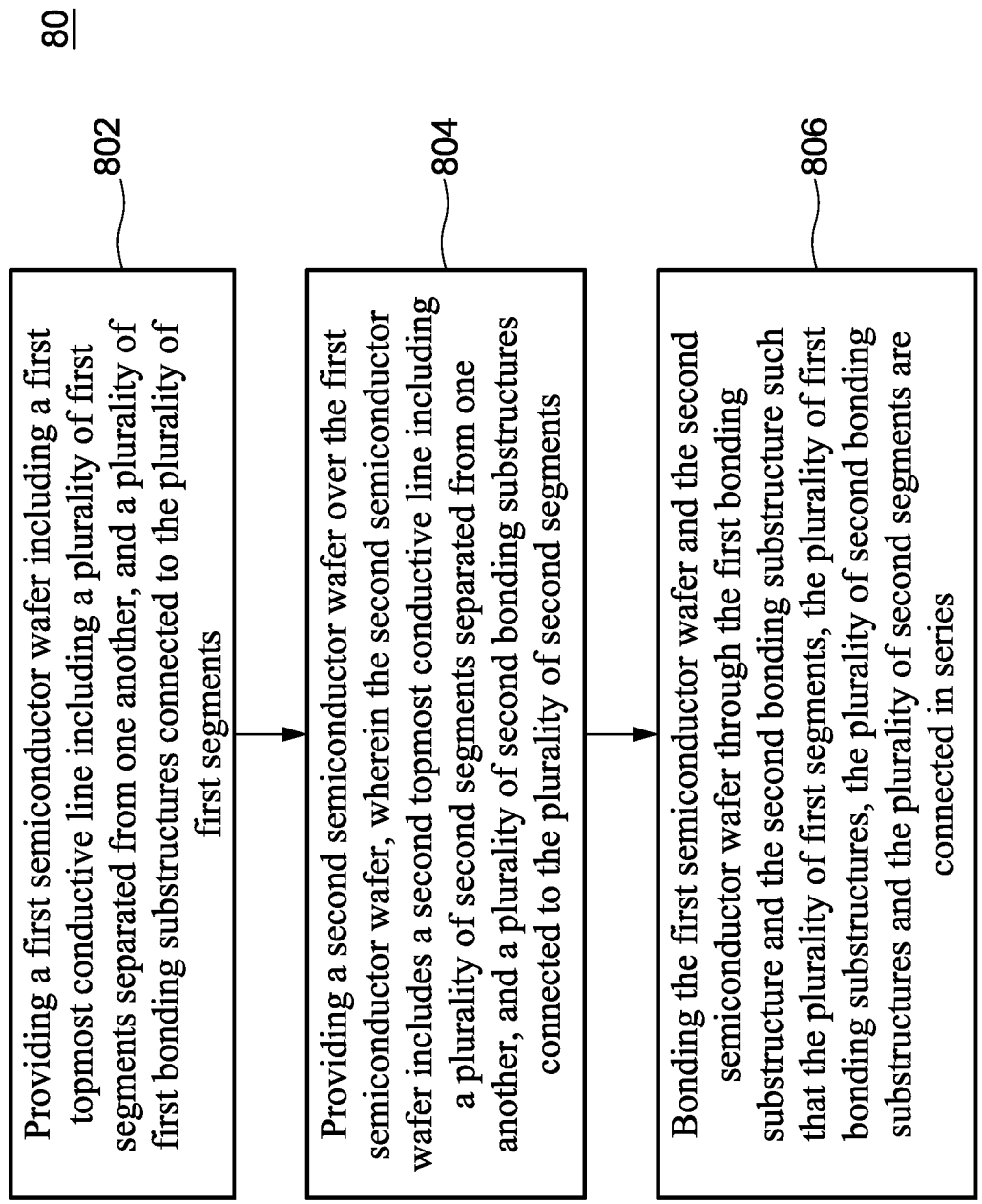
FIG. 7 is a process flow illustrating a method for forming a semiconductor device in accordance with some embodiments of the present disclosure.

FIG. 7 is a process flow illustrating a method 80 for forming a semiconductor device in accordance with some embodiments of the present disclosure. The method 80 includes an operation 802, in which a first semiconductor wafer is provided with a first topmost conductive line including a plurality of first segments separated from one another, and a plurality of first bonding substructures connected to the plurality of first segments. In some embodiments, the first semiconductor wafer is the first semiconductor wafer 100 as stated above. In some embodiments, the first semiconductor wafer includes the first semiconductor die 500 as stated above.

The method 80 further includes an operation 804, in which a second semiconductor wafer is provided over the first semiconductor wafer. The second semiconductor wafer includes a second topmost conductive line including a plurality of second segments separated from one another, and a plurality of second bonding substructures connected to the plurality of second segments. In some embodiments, the second semiconductor wafer is the second semiconductor wafer 200 as stated above. In some embodiments, the second semiconductor wafer includes the second semiconductor die 600 as stated above.

The method 80 further includes an operation 806, in which the first semiconductor wafer and the second semiconductor wafer are bonded through the first bonding substructure and the second bonding substructure such that the plurality of first segments, the plurality of first bonding substructures, the plurality of second bonding substructure and the plurality of second segments are connected in series. In some embodiments, the method further includes directly bonding the first semiconductor wafer and the second semiconductor wafer through the first bonding substructure and the second bonding substructure via Van der Waals force.

Although this method and other methods illustrated and/or described herein are illustrated as a series of acts or events, it will be appreciated that the present disclosure is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

Figure 8:
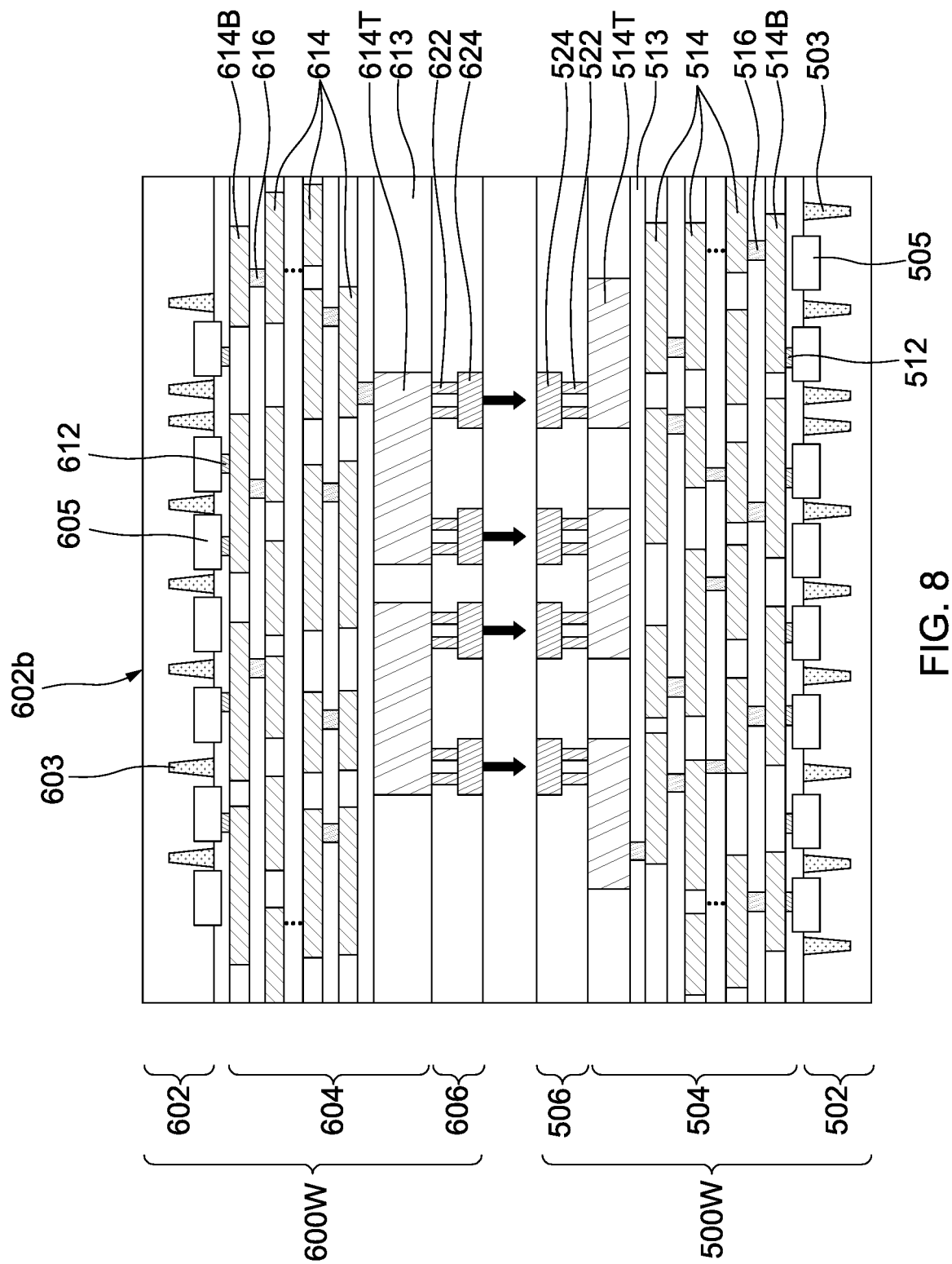
FIGS. 8 to 10 are cross-sectional views of a semiconductor device at various fabrication stages in accordance with some embodiments of the present disclosure.
Figure 9:
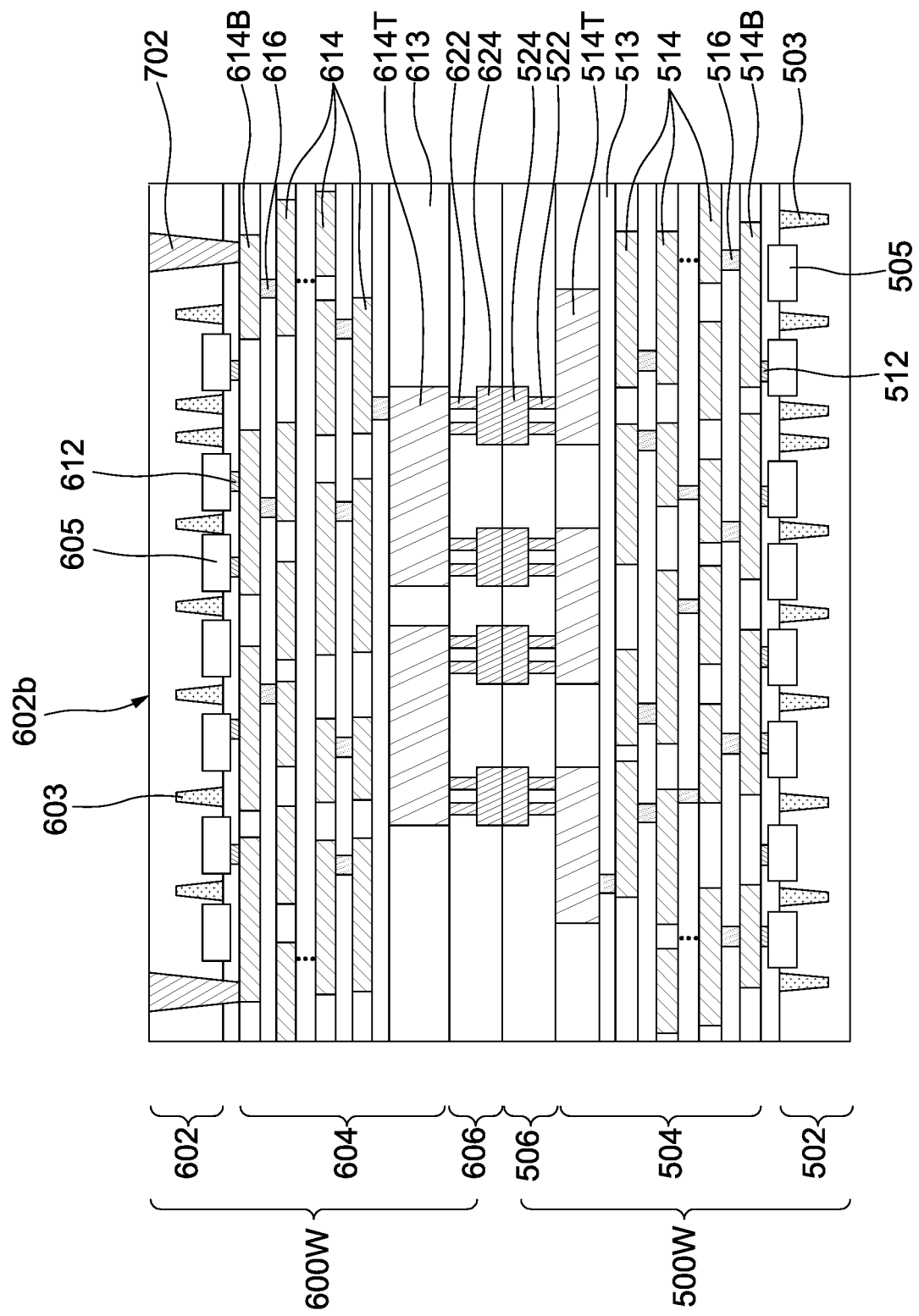
Figure 10:
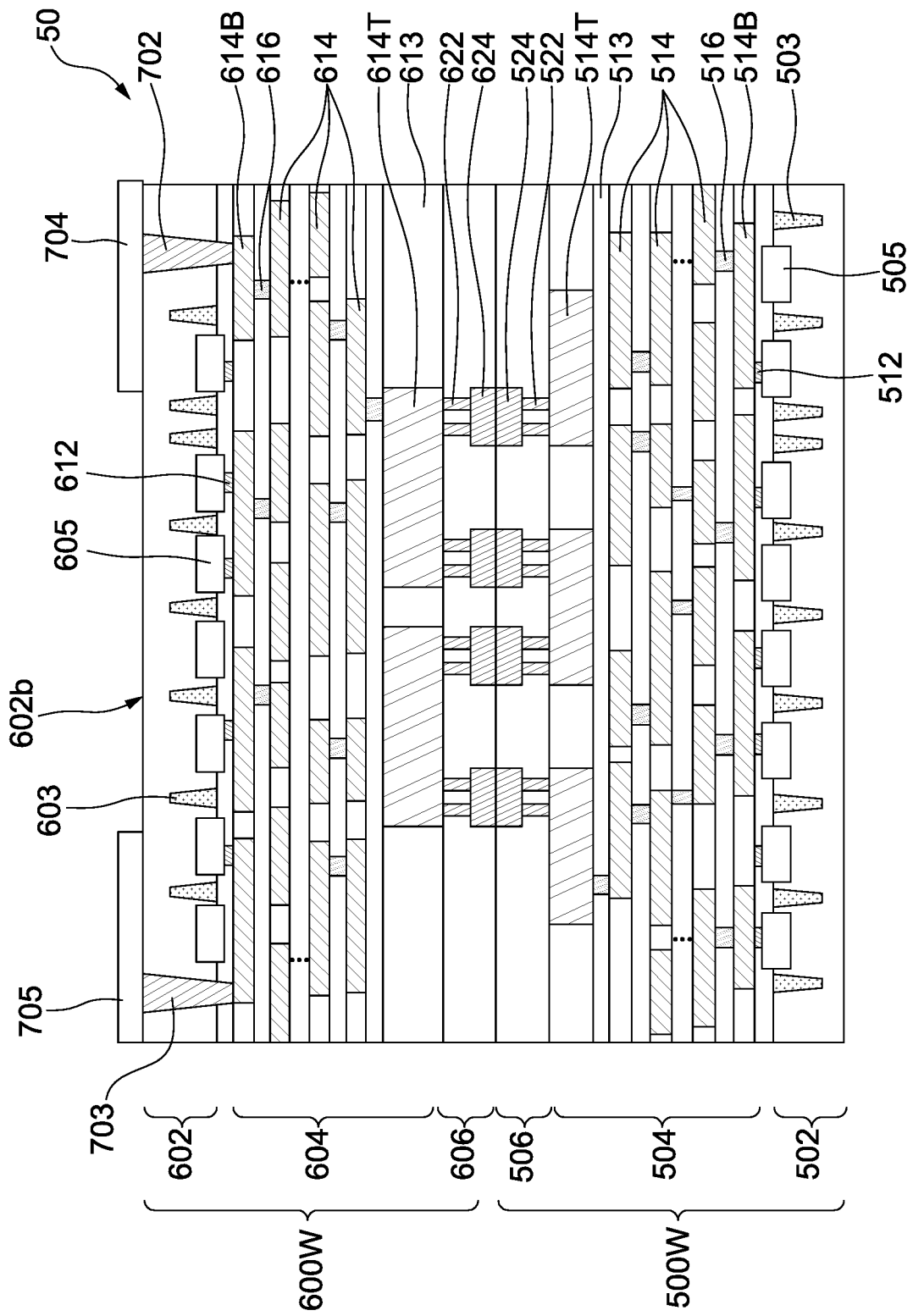

FIGS. 8 to 10 are cross-sectional views of a semiconductor device at various fabrication stages in accordance with some embodiments of the present disclosure. Referring to FIG. 8, a first semiconductor wafer 500W and a second semiconductor wafer 600W are provided according to the operations 802 and 804. In some embodiments, before the first semiconductor wafer 500W and the second semiconductor wafer 500W are bonded, they are aligned to each other, for example, with the assistance of alignment marks, such that each of the first bonding pads 524 is directed to a respective one of the second bonding pads 624.

Referring to FIG. 9, the first semiconductor wafer 500W and the second semiconductor wafer 600W are bonded through the first bonding substructures 506 and the second bonding substructures 606 according to operation 806. The first semiconductor wafer 500W and the second semiconductor wafer 600W are bonded using a wafer direct bonding technique. In some embodiments, the first semiconductor wafer 500W and the second semiconductor wafer 600W are directly bonded via Van der Waals force between the first bonding substructures 506 and the second bonding substructures 606. In some embodiments, a pressure of a suitable magnitude is applied to press the first semiconductor wafer and the second semiconductor wafer to facilitate the formation of Van der Waals bonding. Since the first topmost metallization layer 514 and/or the second topmost metallization layer 614 are designed to include a segmented conductive lines as stated above, instead of continuous conductive lines, the first semiconductor wafer 500W and the second semiconductor wafer 600W can maintain a top surface of better flatness and therefore the bonding between the first semiconductor wafer and the second semiconductor wafer is significantly improved.

In some embodiments, after bonding the first semiconductor wafer 500W and the second semiconductor wafer 600W, a plurality of through vias are formed in the second semiconductor wafer. The plurality of through vias, such as the first through via 702 and the second through via 703, extend from a bottom surface 602b of the second semiconductor substrate 602 to the second bottommost metallization layer 614B. In some embodiments, the plurality of through vias are backside through substrate vias (BTSV).

Referring to FIG. 10, after forming the plurality of through vias, a plurality of contact pads, such as the first contact pad 704 and the second contact pad 705 are formed on the bottom surface 602b of the second semiconductor wafer 600W such that the plurality of contact pads are in contact with the plurality of through vias. The plurality of contact pads allow the first devices 505 and the second devices 605 to be connected to external circuits. After the formation of the contact pads, the bonded first semiconductor wafer 500W and second semiconductor wafer are 600W sawed/singulated to form semiconductor devices, such as the semiconductor device 50 including the first semiconductor die 500 and the second semiconductor die 600 as stated above.

The present disclosure provides a semiconductor device. The semiconductor device are manufactured using wafer-on-wafer technology. The long conductive lines of the topmost metallization layer of two semiconductor wafers are segmented into shorter segments. In some embodiments, by the segmentation, pattern density of the topmost metallization layer is reduced to a sufficiently low value (such as 30%). Accordingly, tensile stress induced by the topmost metallization layer is reduced and thereby the semiconductor wafers can maintain a top surface of better flatness. The wafer warpage issue is thus significantly alleviated. Moreover, advantageously the semiconductor device in accordance with some embodiments of the present disclosure does not show significant increase in electrical resistance and does not require complicated modification of the layout of the semiconductor device or development of a new bonding operation.

In some embodiments, a semiconductor device is provided. The semiconductor device includes a first die, a second die, a first through via, and a second through. The first die includes a first substrate, a first interconnection structure disposed on the first substrate, and a plurality of first bonding substructures over the first interconnect structure. The second die includes a second substrate, a second interconnect structure disposed on the second substrate, and a plurality of second bonding substructures over the second interconnect structure. The plurality of second bonding substructures are bonded to the plurality of first bonding substructures. The first through via and the second through via extend through the second substrate and to the second interconnect structure, wherein the first through via and the second through via are electrically disconnected to each other.

In some embodiments, a semiconductor device is provided. The semiconductor device includes a first device, a second device, a first interconnect structure, a second interconnect structure, and a plurality of bonding structures. The first interconnect structure is electrically connected to the first device, wherein the first interconnect structure comprises a first topmost conductive line. The second interconnect structure is over the first bonding substructures and electrically connected to the second interconnect structure. The plurality of bonding structures is between the first topmost conductive line and the second interconnect structure. The first interconnect structure comprises a topmost metallization layer, and the first topmost conductive line is a portion of the topmost metallization layer of the first interconnect structure, and the first interconnect structure further comprises a plurality of lower metallization layers, and a thickness of the first topmost conductive line is greater than a thickness of the plurality of lower metallization layers.

In some embodiments, a semiconductor device is provided. The semiconductor device includes a first die and a second die. The first die includes a first topmost conductive line and a plurality of first bonding substructures connected to the first topmost conductive line. The second die is over the first die, wherein the second die comprises a second topmost conductive line, and a plurality of second bonding substructures connected to the second topmost conductive line. The first die further comprises a first interconnect structure including a first topmost metallization layer, and the first topmost conductive line is a portion of the first topmost metallization layer of the first interconnect structure. The first interconnect structure further includes a plurality of first lower metallization layers, and a thickness of the first topmost conductive line is greater than a thickness of the plurality of first lower metallization layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first die comprising a first substrate, a first interconnection structure disposed on the first substrate, and a plurality of first bonding substructures over the first interconnect structure;
    a second die comprising a second substrate, a second interconnect structure disposed on the second substrate, and a plurality of second bonding substructures over the second interconnect structure, wherein the plurality of second bonding substructures are bonded to the plurality of first bonding substructures; and
    a first through via and a second through via extending through the second substrate and to the second interconnect structure,
    wherein the first through via and the second through via are electrically disconnected to each other,
    wherein the first interconnect structure comprises a first conductive line including a plurality of first segments separated from each other,
    wherein one of the plurality of first segments has a first length and is separated from an adjacent first segment of the plurality of first segments by a first spacing, and a ratio of the first length to the first spacing is in a range of between 0.6 and 1.2.

2. The semiconductor device of claim 1, wherein the first interconnect structure comprises a first topmost metallization layer connected to the plurality of first bonding substructures and a plurality of first lower metallization layers between the first substrate and the first topmost metallization layer, and a thickness of the first topmost metallization layer is greater than a thickness of the plurality of first lower metallization layers.

3. The semiconductor device of claim 1, wherein each of the plurality of first bonding substructures is bonded to one of the second bonding substructures directly.

4. The semiconductor device of claim 1,
wherein the second interconnect structure comprises a second conductive line including a plurality of second segments separated from each other,
wherein each of the first bonding substructures comprises at least one first conductive via connected to the respective first segment, and a first bonding pad connected to the at least one first conductive via; and/or
wherein each of the second bonding substructures comprises at least one second conductive via connected to a corresponding of the plurality of second segments, and a second bonding pad connected to the at least one second conductive via.

5. The semiconductor device of claim 4,
wherein one of the plurality of second segments has a second length and is separated from an adjacent second segment of the plurality of second segments by a second spacing, and a ratio of the second length to the second spacing is in a range of between 0.6 and 1.2.

6. The semiconductor device of claim 4, wherein one of the plurality of first segments overlaps two adjacent second segments of the plurality of second segments from a top view.

7. The semiconductor device of claim 4,
wherein a first cross section parallel to a top surface of the first substrate has a ratio of an area of the first conductive line to a total area of the first cross section substantially equal to or less than 30%; and/or
wherein a second cross section parallel to a top surface of the second substrate has a ratio of an area of the second conductive line to a total area of the second cross section substantially equal to or less than 30%.

8. The semiconductor device of claim 4, wherein the plurality of first segments, the plurality of first bonding substructures, the plurality of second bonding substructures, and the plurality of second segments are connected in series.

9. The semiconductor device of claim 1, wherein the second interconnect structure comprises a second topmost metallization layer connected to the second bonding substructures and a plurality of second lower metallization layers between the second substrate and the second topmost metallization layer, and a thickness of the second topmost metallization layer is greater than a thickness of the plurality of second lower metallization layers.

10. The semiconductor device of claim 1, wherein the first substrate comprises a first device electrically connected to the first through via, and the second substrate comprises a second device electrically connected to the second through via, and the first through via is electrically disconnected to the second device, and the second through via is electrically disconnected to the first device.

11. A semiconductor device, comprising:
a first substrate and a second substrate on opposite sides of a bounding interface of the semiconductor device;
a first interconnect structure electrically connected to the first substrate, wherein the first interconnect structure comprises a first topmost conductive line;
a second interconnect structure electrically connected to the second substrate and first interconnect structure; and
a plurality of bonding structures between the first topmost conductive line and the second interconnect structure,
wherein the first interconnect structure further comprises a topmost metallization layer, and the first topmost conductive line is a portion of the topmost metallization layer of the first interconnect structure; and
wherein the first interconnect structure further comprises a plurality of lower metallization layers, and a thickness of the first topmost conductive line is greater than a thickness of the plurality of lower metallization layers,
wherein a first cross section parallel to a top surface of the first substrate has a ratio of an area of the first topmost conductive line to a total area of the first cross section substantially equal to or less than 30%.

12. The semiconductor device of claim 11, wherein the first topmost conductive line includes a plurality of first segments separated from each other, the second interconnect structure comprises a second topmost conductive line includes a plurality of second segments separated from each other, wherein one of the plurality of second segments overlaps two of the bonding structures and two of the plurality of first segments.

13. The semiconductor device of claim 11, wherein the first topmost conductive line comprises a plurality of first segments separated from each other, the second interconnect structure comprises a second topmost conductive line including a plurality of second segments, and each of the bonding structures is connected to a respective first segment of the plurality of first segments and a respective second segment of the plurality of second segments such that the plurality of first segments, the plurality of bonding substructures, and the plurality of second segments are connected in series.

14. The semiconductor device of claim 13,
wherein each of the plurality of bonding structures comprises a first bonding substructure connected to the respective first segment and a second bonding substructure connected to the respective second segment,
wherein the first bonding substructure comprises at least one first conductive via connected to a respective first segment of the plurality of first segments, and a first bonding pad connected to the at least one first conductive via; and/or
wherein the second bonding substructure comprises at least one second conductive via connected to a respective second segment of the plurality of second segments, and a second bonding pad connected to the at least one second conductive via.

15. The semiconductor device of claim 14, wherein the first bonding pad is directly bonded to the second bonding pad.

16. A semiconductor device, comprising:
a first die comprising a first topmost conductive line and a plurality of first bonding substructures connected to the first topmost conductive line; and
a second die over the first die, wherein the second die comprises a second topmost conductive line, and a plurality of second bonding substructures connected to the second topmost conductive line,
wherein the first die further comprises a first interconnect structure comprising a first topmost metallization layer, and the first topmost conductive line is a portion of the first topmost metallization layer of the first interconnect structure; and
wherein the first interconnect structure further comprises a plurality of first lower metallization layers, and a thickness of the first topmost conductive line is greater than a thickness of the plurality of first lower metallization layers, wherein the first topmost conductive line comprises a plurality of first segments separated from each other, the second topmost conductive line comprises a plurality of second segments separated from each other, and a first one of the first segments is connected to a second one of the first segments in series through a first one of the plurality of first bonding substructures, a first one of the plurality of second bonding substructures, a first one of the second segments, a second one of the plurality of second bonding substructures and a second one of the plurality of first bonding substructures.

17. The semiconductor device of claim 16,
wherein the plurality of first bonding substructures comprise at least one first conductive via connected to a respective first segment of the plurality of first segments, and a first bonding pad connected to the at least one first conductive via;
wherein the plurality of second bonding substructures comprise at least one second conductive via connected to a respective second segment of the plurality of second segments, and a second bonding pad connected to the at least one second conductive via; and
wherein the first bonding pad is connected to the second bonding pad.

18. The semiconductor device of claim 16, wherein the plurality of first bonding substructures are directly bonded to the plurality of second bonding substructures.

19. The semiconductor device of claim 16, wherein the second die further comprises a second interconnect structure comprising a second topmost metallization layer, and the second topmost conductive line is a portion of the second topmost metallization layer of the second interconnect structure.

20. The semiconductor device of claim 19, wherein the second interconnect structure further comprises a plurality of second lower metallization layers, and a thickness of the second topmost conductive line is greater than a thickness of the plurality of second lower metallization layers of the second interconnect structure.

* * * * *